(12) United States Patent
Honda et al.

(10) Patent No.: US 12,114,423 B2
(45) Date of Patent: Oct. 8, 2024

(54) CIRCUIT BOARD AND PROBE CARD

(71) Applicant: KYOCERA Corporation, Kyoto (JP)

(72) Inventors: Youichiro Honda, Kyoto (JP); Yoshihiro Toda, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 151 days.

(21) Appl. No.: 17/796,003

(22) PCT Filed: Jan. 25, 2021

(86) PCT No.: PCT/JP2021/002417
§ 371 (c)(1),
(2) Date: Jul. 28, 2022

(87) PCT Pub. No.: WO2021/153494
PCT Pub. Date: Aug. 5, 2021

(65) Prior Publication Data
US 2023/0076558 A1  Mar. 9, 2023

(30) Foreign Application Priority Data
Jan. 30, 2020  (JP) .................................. 2020-013087

(51) Int. Cl.
G01R 31/20  (2006.01)
G01R 1/073  (2006.01)
H05K 1/02  (2006.01)
H05K 1/11  (2006.01)

(52) U.S. Cl.
CPC ....... *H05K 1/0296* (2013.01); *G01R 1/07342* (2013.01); *H05K 1/115* (2013.01); *H05K 2201/0929* (2013.01)

(58) Field of Classification Search
CPC ............ G01R 1/07314; G01R 1/07342; G01R 31/2889; H05K 1/115; H05K 1/116; H05K 1/0296; H05K 1/0262; H05K 2201/09227; H05K 2201/0929
See application file for complete search history.

(56) References Cited

U.S. PATENT DOCUMENTS

| 9,560,758 | B2* | 1/2017 | Matsumoto | H05K 1/0251 |
| 9,977,052 | B2* | 5/2018 | Suto | G01R 31/2808 |
| 2009/0051041 | A1* | 2/2009 | Otsuka | H01L 23/49822 257/774 |
| 2012/0169367 | A1* | 7/2012 | Kuo | G01R 31/2889 324/756.03 |

(Continued)

FOREIGN PATENT DOCUMENTS

| JP | 2005-150338 A | 6/2005 |
| JP | 2005-347551 A | 12/2005 |

(Continued)

*Primary Examiner* — Thang X Le
(74) *Attorney, Agent, or Firm* — Volpe Koenig

(57) ABSTRACT

A circuit board includes an insulating substrate having a first surface and a second surface opposite to the first surface, a solid conductor located inside the insulating substrate, a first via conductor connected to the solid conductor from a side of the first surface, and a second via conductor connected to the solid conductor from a side of the second surface. The solid conductor has a cutout that intersects a line segment that connects a node of the first via conductor and a node of the second via conductor to each other.

14 Claims, 12 Drawing Sheets

(56) References Cited

U.S. PATENT DOCUMENTS

| | | | |
|---|---|---|---|
| 2016/0157336 A1* | 6/2016 | Murai | H05K 1/0234 |
| | | | 361/782 |
| 2017/0019990 A1* | 1/2017 | Takemura | H05K 1/0271 |
| 2019/0246498 A1* | 8/2019 | Numagi | H05K 1/114 |

FOREIGN PATENT DOCUMENTS

| | | |
|---|---|---|
| JP | 2009-111132 A | 5/2009 |
| JP | 2011-238974 A | 11/2011 |
| JP | 2013-140952 A | 7/2013 |
| JP | 2016-100434 A | 5/2016 |

\* cited by examiner

CIRCUIT BOARD AND PROBE CARD

TECHNICAL FIELD

The present disclosure relates to a circuit board and a probe card.

BACKGROUND

In a circuit board, when power supply voltages are sent to respective portions, voltage drops occur in power supply conductors, sometimes causing a difference between the power supply voltages supplied to the respective portions. Japanese Unexamined Patent Application Publication No. 2005-150338 describes a circuit board which, to reduce such a difference between the power supply voltages as described above, includes a plurality of power supply lines which transmit a plurality of power supply voltages slightly different in voltage from one another, has appropriately selected power supply lines connected to power supply conductors of respective portions, and achieves uniformization of the power supply voltages.

SUMMARY

A circuit board according to the present disclosure includes:

an insulating substrate having a first surface and a second surface opposite to the first surface;

a solid conductor located inside the insulating substrate;

a first via conductor connected to the solid conductor from a side of the first surface; and a second via conductor connected to the solid conductor from a side of the second surface, in which the solid conductor has a cutout that intersects a line segment that connects a node of the first via conductor and a node of the second via conductor to each other.

A probe card according to the present disclosure includes:

the above-described circuit board; and a probe pin electrically connected to the solid conductor through the first via conductor.

DETAILED DESCRIPTION

An embodiment of the present disclosure will be described in detail with reference to the drawings.

Figure 1A:
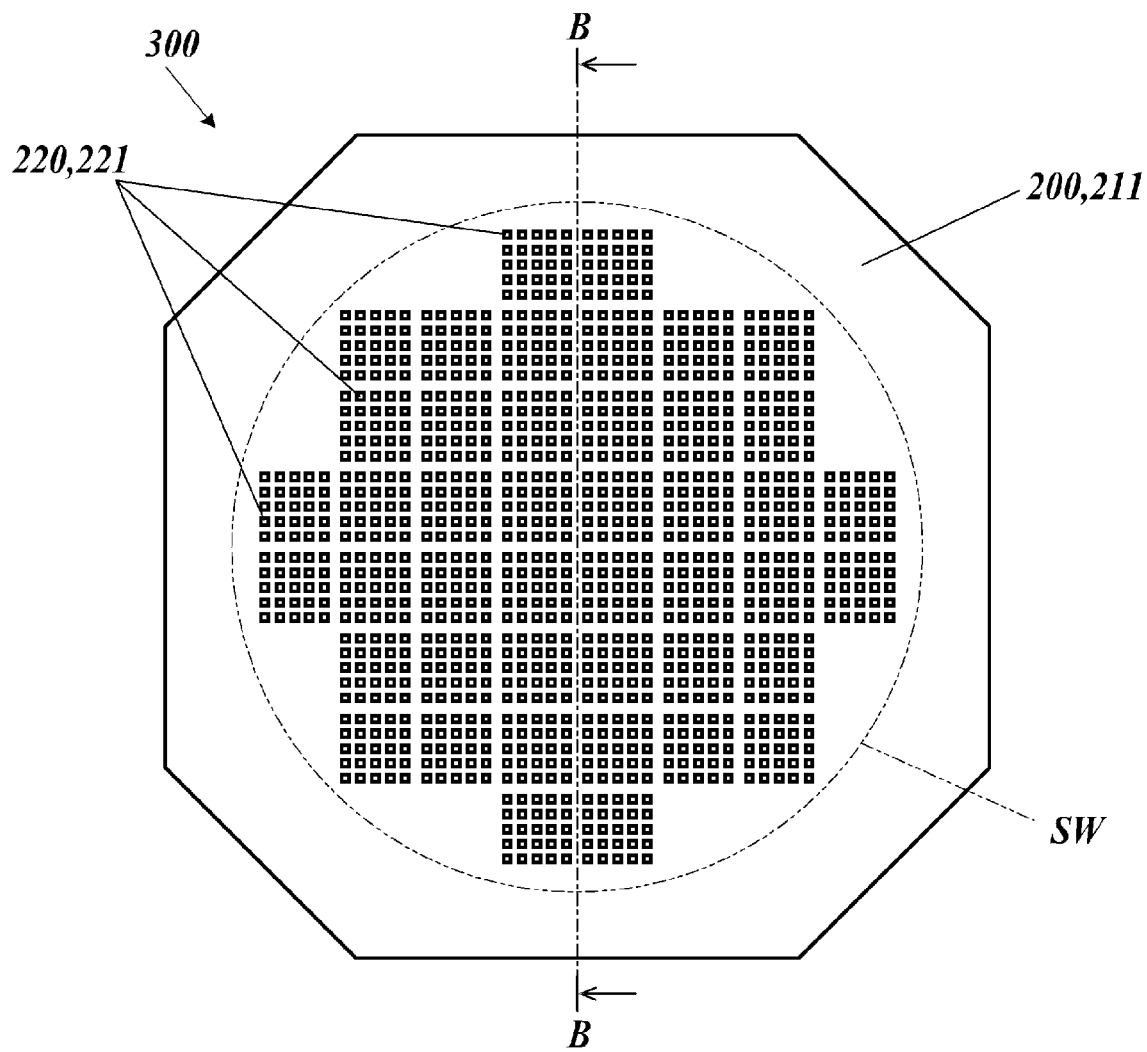
FIG. 1A is a plan view illustrating a probe card according to an embodiment of the present disclosure.
Figure 1B:
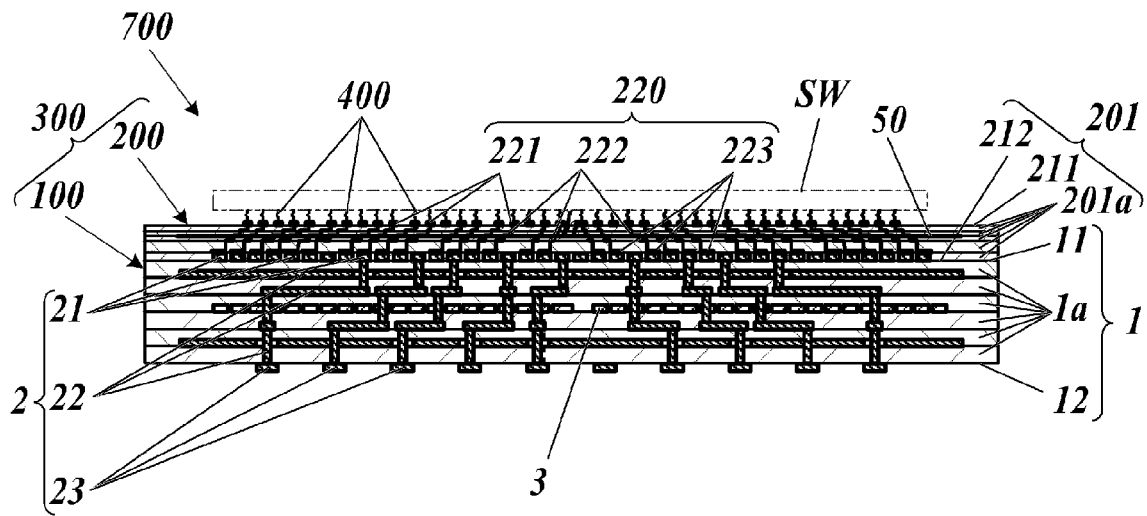
FIG. 1B is a sectional view along line B-B of FIG. 1A.

FIG. 1A is a plan view illustrating a probe card according to the embodiment of the present disclosure. FIG. 1B is a sectional view along line B-B of FIG. 1A. A probe card 700 according to the present embodiment includes a first circuit board 100, a second circuit board 200, and a plurality of probe pins 400. The first circuit board 100 includes: an insulating substrate 1 in which a plurality of ceramic insulating layers 1a are stacked on one another; and a circuit conductor 2. The second circuit board 200 includes: an insulating substrate 201 in which a plurality of resin insulating layers 201a are stacked on one another; and a circuit conductor 220. The first circuit board 100 and the second circuit board 200 fit to each other to constitute a circuit board 300. FIG. 1A illustrates the circuit board 300 to which the probe pins 400 are not joined.

The insulating substrate 1 of the first circuit board 100 has a first surface 11 and a second surface 12 opposite to the first surface 11. The circuit conductor 2 of the first circuit board 100 includes: a plurality of bonding conductors 21 located on the first surface 11; a plurality of external terminals 23 located on the second surface 12; and internal conductors 22 located from the first surface 11 to the second surface 12. The first circuit board 100 may include heater lines 3 for raising temperature.

The insulating substrate 201 of the second circuit board 200 has a first surface 211 and a second surface 212 opposite to the first surface 211. The circuit conductor 220 of the second circuit board 200 includes: a plurality of bonding conductors 221 located on the first surface 211; a plurality of bonding conductors 223 located on the second surface 212; and a plurality of internal conductors 222 located from the first surface 211 to the second surface 212.

The first circuit board 100 and the second circuit board 200 overlap each other so that the plurality of bonding conductors 21 of the first circuit board 100 and the plurality of bonding conductors 223 of the second circuit board 200 are bonded to each other, in which the first surface 11 of the first circuit board 100 and the second surface 212 of the second circuit board 200 are adhered to each other. The plurality of probe pins 400 are bonded to the plurality of bonding conductors 221 of the second circuit board 200.

The internal conductors 22 of the first circuit board 100 and the internal conductors 222 of the second circuit board 200 include: via conductors which extend in a direction perpendicular to a substrate surface (any of the first surfaces 11 and 211 and the second surfaces 12 and 212); and film-shaped conductors which extend in a direction along the substrate surface.

A solid conductor 50 is included in the film-shaped conductors of the internal conductors 22, the film-shaped conductors of the internal conductors 222, or both of the film-shaped conductors. FIG. 1B illustrates an example in which the solid conductor 50 is included in the internal conductors 222. Between a pair of the ceramic insulating layers 1a and 1a vertically adjacent to each other, or between a pair of the resin insulating layers 201a vertically adjacent to each other, the solid conductor 50 has a two-dimensional area that is notably large longitudinally and laterally compared with a diameter of the via conductors. In the present description, the solid conductor is defined as a conductor that has a longitudinal dimension and a lateral dimension, each of which is 15 times or more the diameter of the via conductors.

Figure 2:
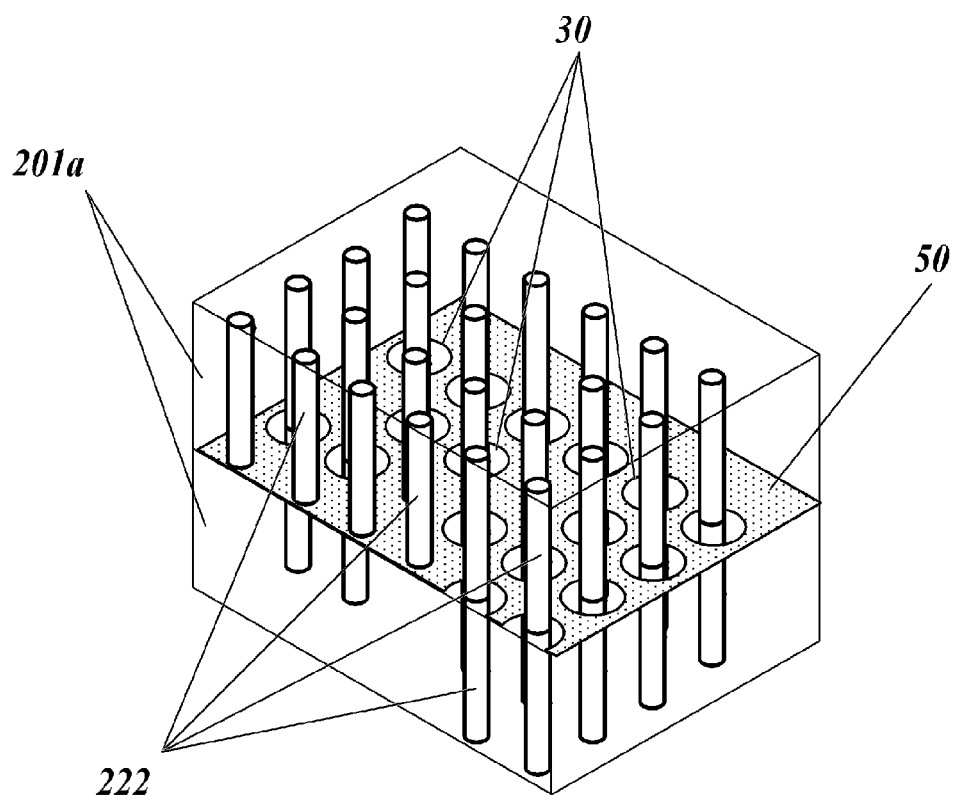
FIG. 2 is a view illustrating an example of a structure of intersecting portions of a solid conductor and via conductor.

FIG. 2 is a view illustrating an example of a structure of intersecting portions of the solid conductor and the via conductors.

The solid conductor 50 is supplied with power supply voltages from one or the plurality of external terminals 23 on the second surface 12 side and outputs the power supply voltages to one or the plurality of bonding conductors 221 on the first surface 211 side. The power supply voltages are a concept that includes a ground voltage. As illustrated in FIG. 2, the solid conductor 50 may have through holes 30 through which the internal conductors 222 which intersect the solid conductor 50 and are insulated therefrom are passed. The internal conductors 222 are replaced by the internal conductors 22 when the solid conductor 50 is included in the first circuit board 100.

A description will be given below on the assumption that the solid conductor 50 is included in the second circuit board 200. In addition, the via conductors (the internal conductors 222) on the first surface 11 side, which are connected to the solid conductor 50, will be called output vias, and the via conductors (the internal conductors 222) on the second surface 12 side, which are connected to the solid conductor 50, will be called input vias. Moreover, it is assumed that the input vias extend to the second surface 12 and are connected to the bonding conductors 221, and that the output vias extend to the first surface 11 and are connected to the bonding conductors 223. The solid conductor 50 is supplied with the power supply voltages from the bonding conductors 221 and the input vias, and the power supply voltages are output therefrom through the bonding conductors 223 and the output vias. The above-described identification of the configuration is merely for convenience of explanation, and the solid conductor 50 may be included in the first circuit board 100. Moreover, the input vias and the output vias may be connected to the film-shaped conductors along the way and may be electrically connected to the bonding conductors 221 and 223 (or the bonding conductors 21 and the external terminals 23) positionally different in the direction of the substrate surface.

ARRANGEMENT EXAMPLES OF CUTOUT

FIGS. 3A to 3C, FIGS. 5A to 5C, FIGS. 7A to 7D, FIGS. 9A to 9D, FIGS. 11A to 11D, and FIGS. 12A to 12D are views schematically illustrating Arrangement examples 1 to 6 of a cutout of the solid conductor and the via conductors. FIGS. 4A to 4C, FIGS. 6A to 6C, FIGS. 8A to 8D, and FIGS. 10A to 10D are views illustrating Comparative examples 1 to 4, none of which have the cutout. In the above-described drawings, paths where large differences occur due to the cutouts are denoted by reference symbols including "a". The second surfaces 212 of FIG. 3C, FIG. 4C, FIG. 5C, FIG. 6C, FIG. 7D, FIG. 8D, FIG. 9D, FIG. 10D, FIG. 11D, and FIG. 12D indicate orientations thereof when transparently viewed from the first surface 211 side.

Arrangement Example 1

Examples of FIG. 3 and FIG. 4 are examples in which a power supply voltage is input to the solid conductor 50 through an input via 61 and the power supply voltage is output to output vias 71A and 71B through the solid conductor 50. The output via 71A as one of the output vias 71A and 71B is close to the input via 61, and the output via 71B as the other thereof is far from the input via 61.

Figure 4A:
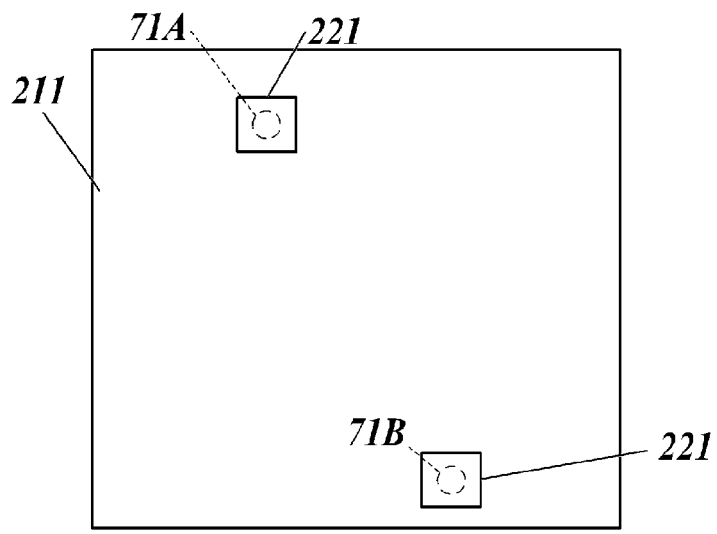
FIG. 4A is a view illustrating a first surface in Comparative example 1 that does not include a cutout.
Figure 4B:
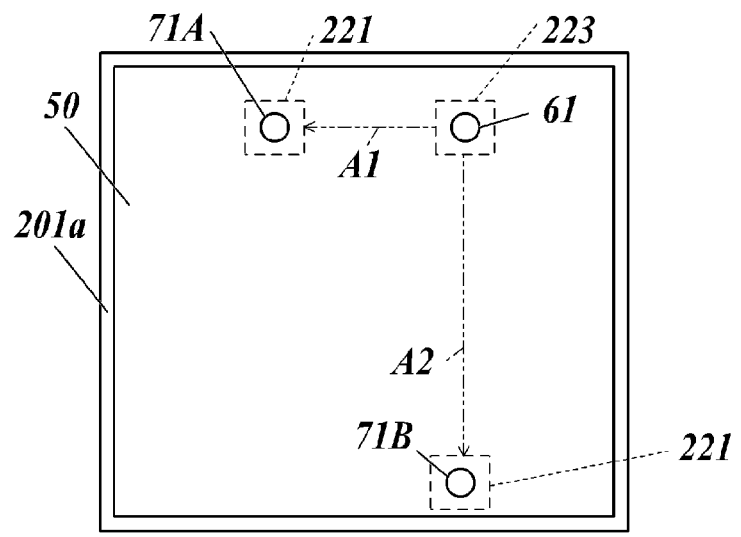
FIG. 4B is a solid conductor in Comparative example 1.
Figure 4C:
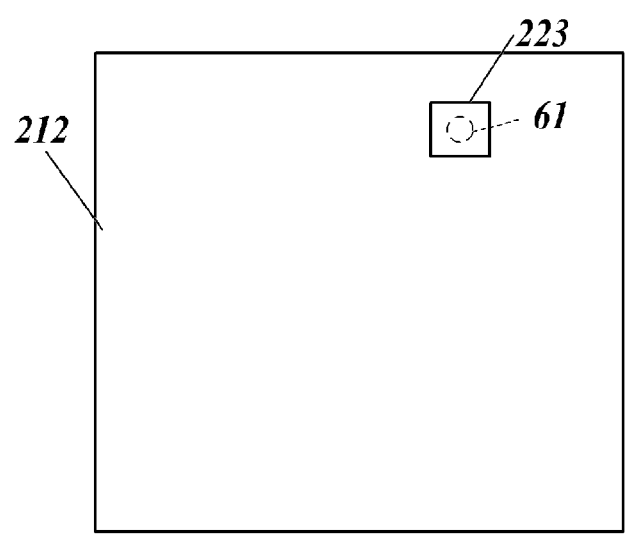
FIG. 4C is a view illustrating a second surface in Comparative example 1.

In Comparative example 1 of FIG. 4B, on the basis of a difference between distances from the above-described input via 61, voltage drops of which amounts differ between the output via 71A and the output via 71B occur when power supply currents flow from the input via 61 to the output vias 71A and 71B as in current paths A1 and A2. Hence, a difference occurs between the power supply voltage output to the output via 71A and the power supply voltage output to the output via 71B.

Figure 3A:
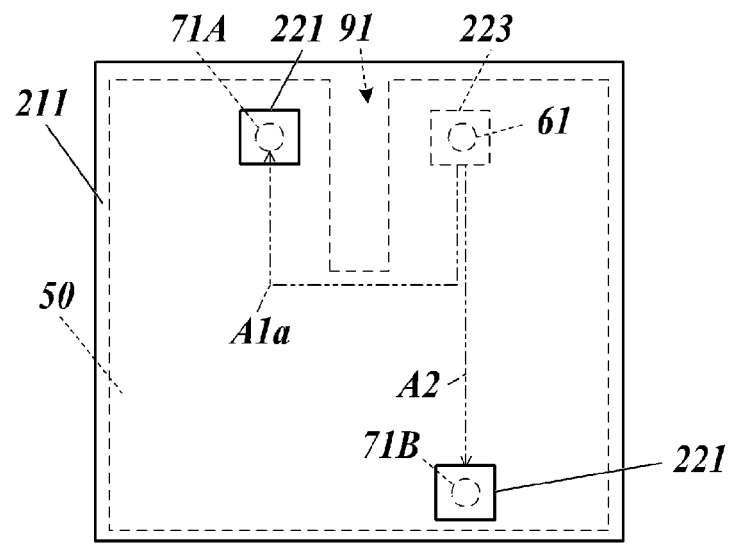
FIG. 3A is a view illustrating a first surface in Arrangement example 1.
Figure 3B:
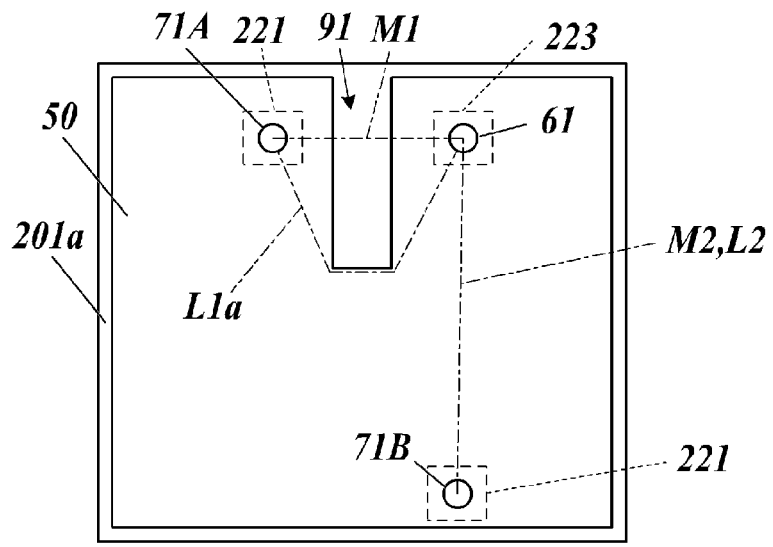
FIG. 3B is a view illustrating a solid conductor in Arrangement example 1.
Figure 3C:
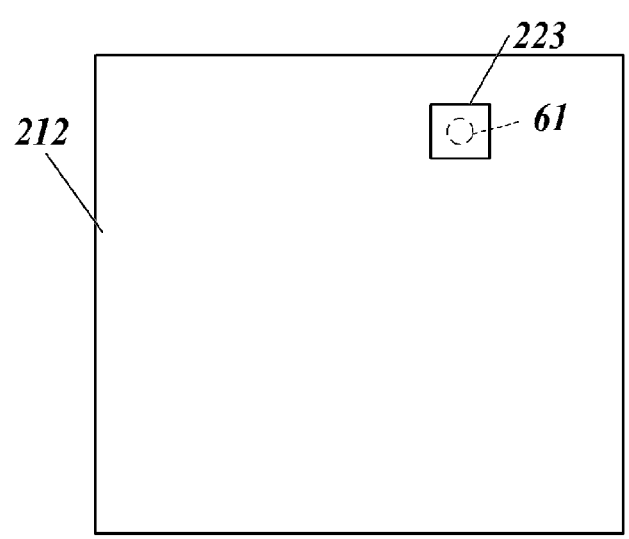
FIG. 3C is a view illustrating a second surface in Arrangement example 1.

As illustrated in FIG. 3B, the solid conductor 50 of the present embodiment has a cutout 91. The cutout 91 may have a slit shape. The cutout is a partially cut out portion in a two-dimensional area surrounded by straight lines and outwardly protruding corners or by a curve and includes one present from when the solid conductor is formed. The slit shape may be defined as a shape that is elongated in one direction, in which a longer dimension is twice or more a shorter dimension.

The cutout 91 intersects a line segment M1 that connects a node of the input via 61 and the solid conductor 50 and a node of the output via 71A and the solid conductor 50 to each other. Moreover, the cutout 91 is disposed so that a difference between path lengths of shortest conduction paths L1a and L2 becomes smaller than a difference between lengths of the line segments M1 and M2. The line segment M2 is a line segment between the node of the input via 61 and the node of the output via 71B. The shortest conduction path L1a is the shortest conduction path between the input via 61 and the output via 71A. The shortest conduction path L2 is the shortest conduction path between the input via 61 and the output via 71B. It is defined that the difference between the line segments and the difference between the path lengths are represented by absolute values. The same applies below.

The shortest conduction path L1a from the input via 61 to the output via 71A is lengthened by the cutout 91, and a resistance (an electrical resistance) therebetween increases. Then, a length of an average current path A1a from the input via 61 to the output via 71A and a length of an average current path A2 from the input via 61 to the output via 71B become closer to each other. That is, a difference between lengths of the current paths A1a and A2 of the embodiment of FIG. 3 is smaller than a difference between lengths of current paths A1 and A2 of Comparative example 1 (FIG. 4) that does not have the cutout 91. Hence, compared with Comparative example 1 of FIG. 4, the cutout 91 causes a drop in the amount of voltage to the output via 71A to become closer to a drop in the amount of voltage to the output via 71B, and the difference between the power supply voltages output to the two output vias 71A and 71B can be reduced. Note that the average current paths A1a and A2 are those which symbolically represent magnitudes of total resistances from input points to output points, and path lengths thereof are proportional to the resistances. The same also applies to FIG. 5 to FIG. 12.

Note that, when the number of input vias and the number of output vias increase, the arrangement of the cutout that brings the path lengths of the average current paths to the respective output vias close to one another becomes complicated. However, for example, examples in which cutouts with a variety of patterns are provided are compared with one another using a circuit simulator, such that the arrangement of the cutout that brings the power supply voltages output to the respective output vias close to one another can be appropriately calculated.

Arrangement Example 2

Examples of FIG. 5 and FIG. 6 are examples in which two input vias 62A and 62B and two output vias 72A and 72B are connected to the solid conductor 50. With respect to the two input vias 62A and 62B, the output via 72B is farther therefrom than the output via 72A.

Figure 6A:
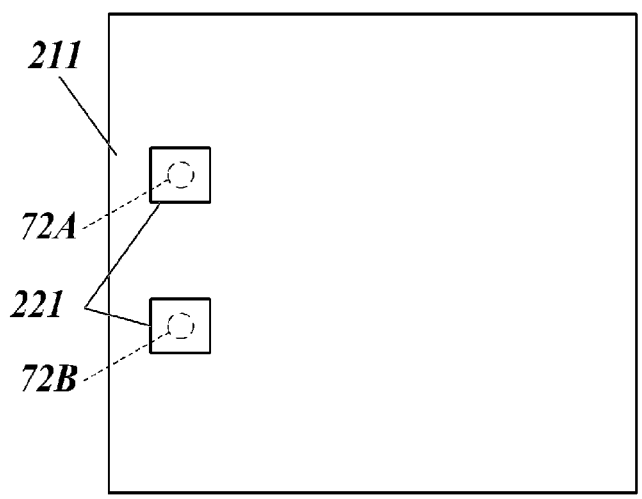
FIG. 6A is a view illustrating a first surface in Comparative example 2 that does not include a cutout.
Figure 6B:
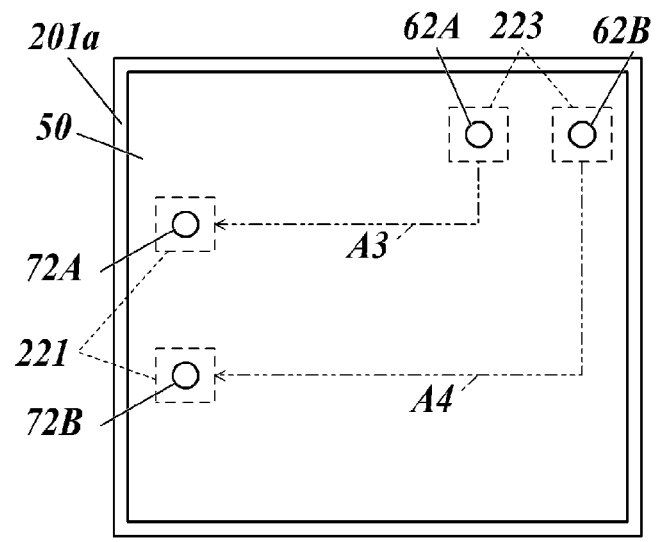
FIG. 6B is a view illustrating a solid conductor in Comparative example 2.
Figure 6C:
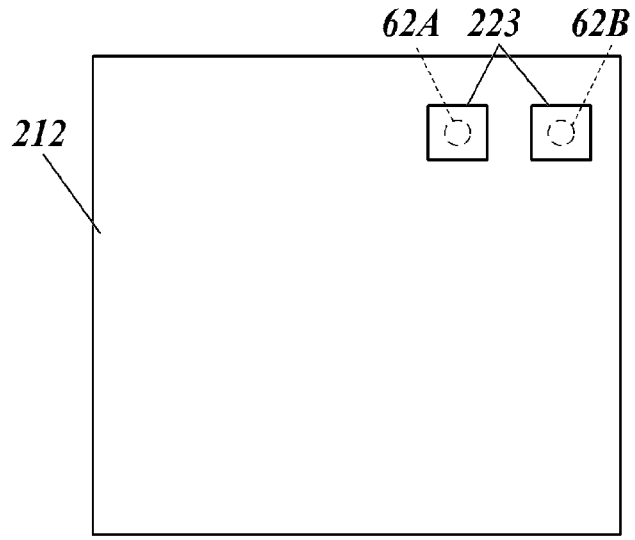
FIG. 6C is a view illustrating a second surface in Comparative example 2.
Figure 7A:
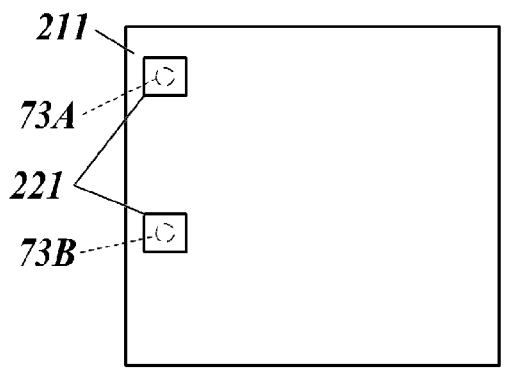
FIG. 7A is a view illustrating a first surface in Arrangement example 3.
Figure 7B:
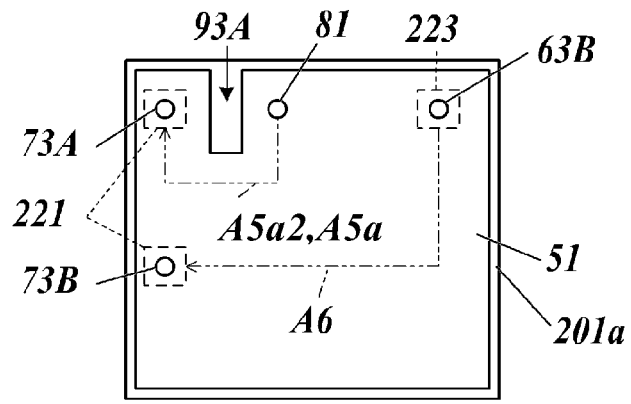
FIG. 7B is a view illustrating a first solid conductor in Arrangement example 3.
Figure 7C:
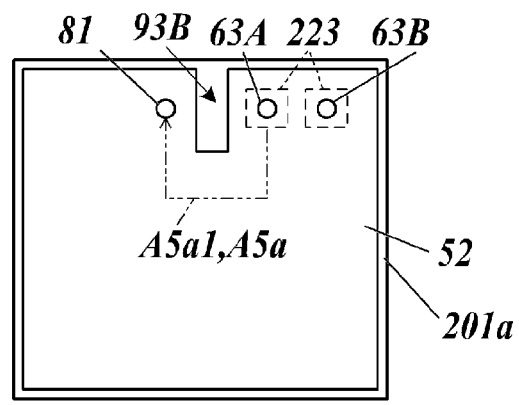
FIG. 7C is a view illustrating a second solid conductor in Arrangement example 3.
Figure 7D:
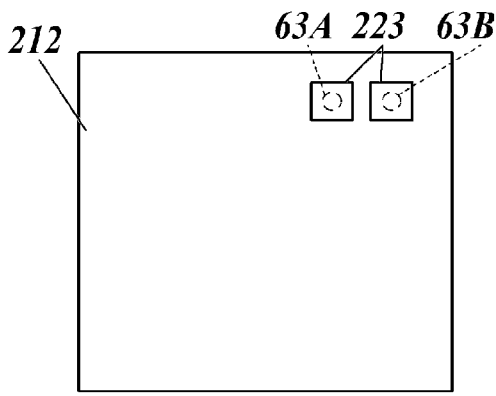
FIG. 7D is a view illustrating a second surface in Arrangement example 3.
Figure 8A:
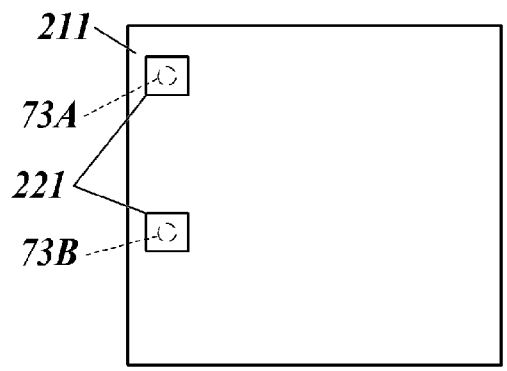
FIG. 8A is a view illustrating a first surface in Comparative example 3 that does not include a cutout.
Figure 8B:
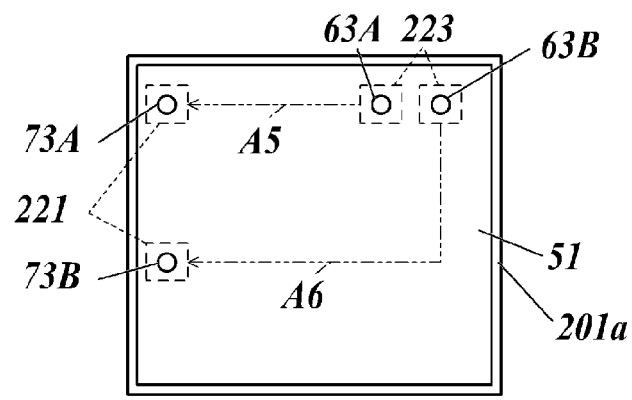
FIG. 8B is a view illustrating a first solid conductor in Comparative example 3.
Figure 8C:
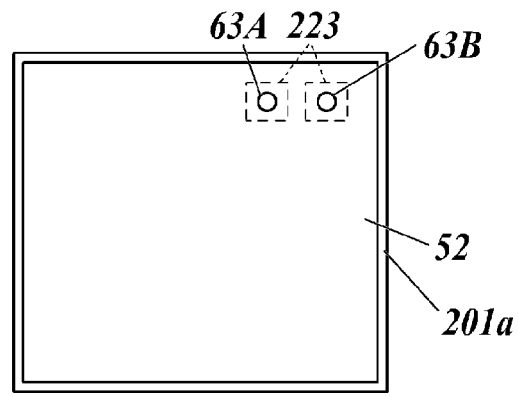
FIG. 8C is a view illustrating a second solid conductor in Comparative example 3.
Figure 8D:
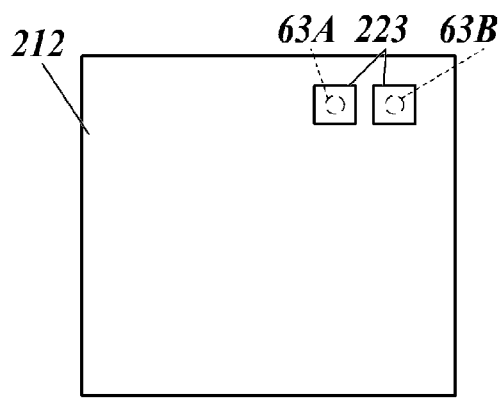
FIG. 8D is a view illustrating a second surface in Comparative example 3.

In Comparative example 2 of FIG. 6B, an average current path A3 from the two input vias 62A and 62B to the output via 72A is shorter than an average current path A4 from the two input vias 62A and 62B to the output vias 72B. Hence, a difference occurs between power supply voltages output to the output vias 72A and 72B. The drawing illustrates each of the average current paths A3 and A4 as a path that extends from either one of the plurality of input vias 62A and 62B; however, this is symbolic. The path lengths of the average current path A3 symbolically represent resistance values between the plurality of input vias 62A and 62B and the one output via 72A, and the path lengths of the average current path A4 symbolically represent resistance values between the plurality of input vias 62A and 62B and the one output via 72B. The same applies below.

Figure 5A:
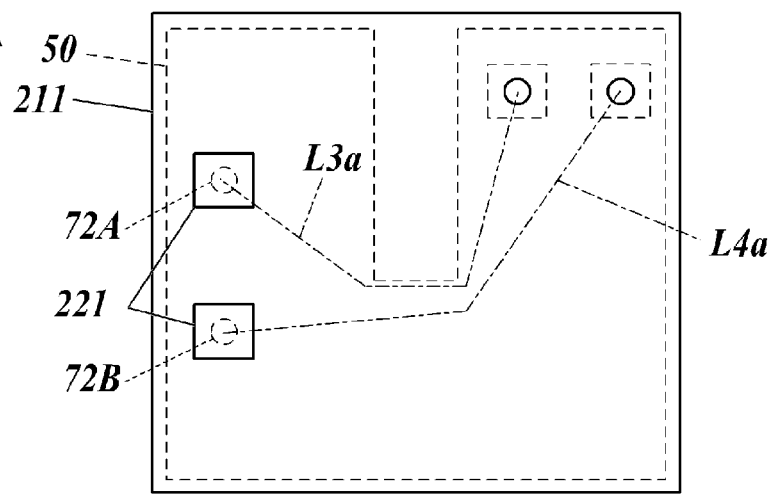
FIG. 5A is a view illustrating a first surface in Arrangement example 2.
Figure 5B:
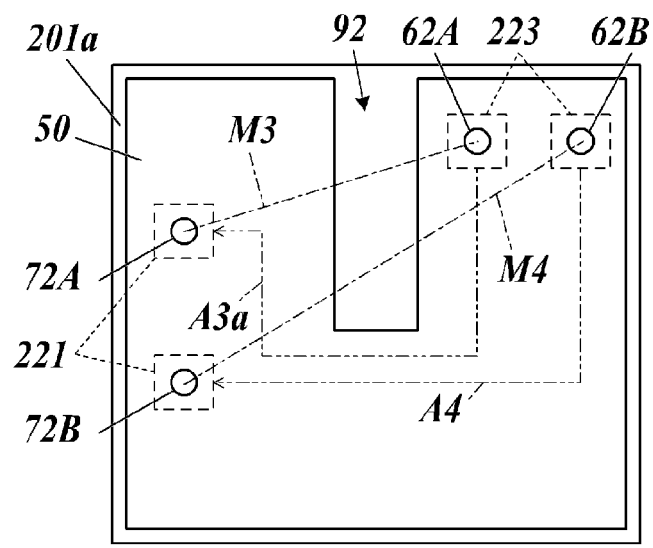
FIG. 5B is a view illustrating a solid conductor in Arrangement example 2.
Figure 5C:
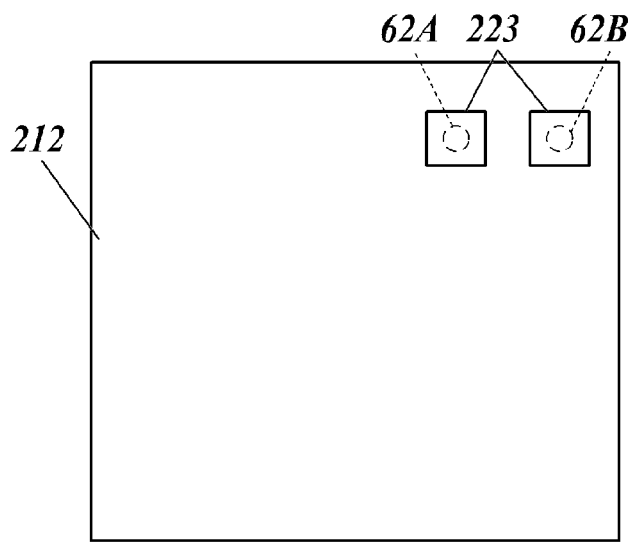
FIG. 5C is a view illustrating a second surface in Arrangement example 2.

As illustrated in FIG. 5B, the solid conductor 50 of the present embodiment has a cutout 92. The cutout 92 may have a slit shape, intersects line segments M3 and M4 which connect nodes of the input vias 62A and 62B and the output vias 72A and 72B to each other, and reduces a difference between a length of a shortest conduction path L3a from the input vias 62A and 62B to the output via 72A and a length of a shortest conduction path L4a therefrom to the output via 72B. Hence, compared with Comparative example 2 of FIG. 6B, the cutout 92 causes a path length of an average current path A3a to the output via 72A and a path length of the average current path A4 to the output via 72B to become closer to each other. That is, a difference between such lengths of the current paths A3a and A4 of the embodiment of FIG. 5 is smaller than a difference between lengths of the current paths A3 and A4 of Comparative example 2 (FIG. 6) that does not have the cutout 92. As described above, the lengths of the shortest conduction paths are adjusted by the cutout 92, such that the lengths of the average current paths A3a and A4 become closer to each other, and the difference between the power supply voltages output to the output vias 72A and 72B can be reduced.

Arrangement Example 3

Examples of FIG. 7 and FIG. 8 are examples in which a first solid conductor 51 and a second solid conductor 52, which are two layers, are located between input vias 63A and 63B and output vias 73A and 73B. Between the first solid conductor 51 and the second solid conductor 52, an intermediate via 81 to be made conductive with only the first solid conductor 51 and the second solid conductor 52 may be included. The intermediate via 81 functions as an input via for the first solid conductor 51 and functions as an output via for the second solid conductor 52.

In Comparative example 3 of FIGS. 8A to 8D, path lengths of average current paths A5 and A6 differ from each other due to a difference between distances between the two input vias 63A and 63B and the two output vias 73A and 73B, and a difference occurs between power supply voltages of the output vias 73A and 73B.

In the present embodiment, as illustrated in FIGS. 7A to 7D, the first solid conductor 51 and the second solid conductor 52 have cutouts 93A and 93B. The cutouts 93A and 93B lengthen the shortest conduction path from the input via 63A to the intermediate via 81 and the shortest conduction path from the intermediate via 81 to the output via 73A. Hence, path lengths of an average current path A5a (=A5a1+ A5a2) and the average current path A6 become closer to each other, and the difference between the power supply voltages of the output vias 73A and 73B can be reduced.

Herein, it is assumed that there are plural layers of solid conductors like the first solid conductor 51 and the second solid conductor 52. In this case, the cutout is provided on each of the plural layers of solid conductors, such that the shortest conduction path from the input via to a certain output via can be lengthened by combining an adjustment for the shortest conduction path by a cutout of a certain layer and an adjustment for the shortest conduction path by a cutout of another layer with each other. Hence, there is enabled a step-by-step adjustment, which includes, for example, implementation of a rough adjustment of the shortest conduction path in the cutout of the solid conductor on the power supply voltage input side, and implementation of a fine adjustment of the shortest conduction path in the cutout of the solid conductor on the power supply voltage output side. The step-by-step adjustment is useful in the case where the number of input vias and the number of output vias are large. The cutout of the solid conductor on the power supply voltage input side may be enlarged (a longitudinal length thereof may be lengthened), and the cutout of the solid conductor on the power supply voltage output side may be reduced in size (a longitudinal length thereof may be shortened). Such a size variation between the cutouts can achieve a fine adjustment closer to the output side, and the power supply voltages can be uniformized with high accuracy. Moreover, the shortest conduction paths can be adjusted by the plural layers of cutouts, and accordingly, the length of each layer of cutouts can be made shorter compared with that in the case of implementing the adjustment by only a cutout in a single layer. Hence, a reduction ratio of the area of each solid conductor layer, where such a reduction is enabled by the cutout, is reduced, and stability of the power supply voltages due to the solid conductors is less likely to be hindered. Moreover, the cutouts in the plural layers of solid conductors are arranged at the positions different from each other when transparently viewed from the direction perpendicular to the substrate surface. In this way, options for the arrangement and patterns of the cutouts in the respective layers are increased, and it also becomes possible to make a selection to shorten total lengths of the cutouts for this amount. The total lengths of the cutouts are shortened, such that the total voltage drop amount due to the cutouts decreases, and a power supply resistance can be suppressed from increasing.

Arrangement Example 4

Examples of FIG. 9 to FIG. 12 are examples in which the number of input vias 64A to 64C and the number of output vias 74A to 74C are larger. In a configuration (FIGS. 10A to 10D) of Comparative example 4, distances from the input vias 64A to 64C to the output vias 74A to 74C differ from one another, and differences occur between path lengths of average current paths A7 to A9. Hence, differences occur between power supply voltages of the plurality of output vias 74A to 74C.

In Arrangement example 4 (FIGS. 9A to 9D) of the present embodiment, the first solid conductor 51 and the second solid conductor 52 have cutouts 94A to 94C. The cutouts 94A and 94C lengthen the shortest conduction path from the input via 64A to an intermediate via 82 and the shortest conduction path from the intermediate via 82 to the output via 74A. The cutout 94B lengthens the shortest conduction path from the input via 64B to the output via 74B. Then, path lengths of average current paths A1a (=A7a1+A7a2), A8a, and A9 become closer to one another, and differences between the power supply voltages of the output vias 74A, 74B, and 74C can be reduced.

Figure 9A:
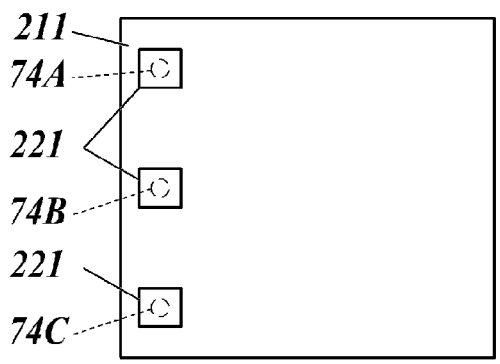
FIG. 9A is a view illustrating a first surface in Arrangement example 4.
Figure 9B:
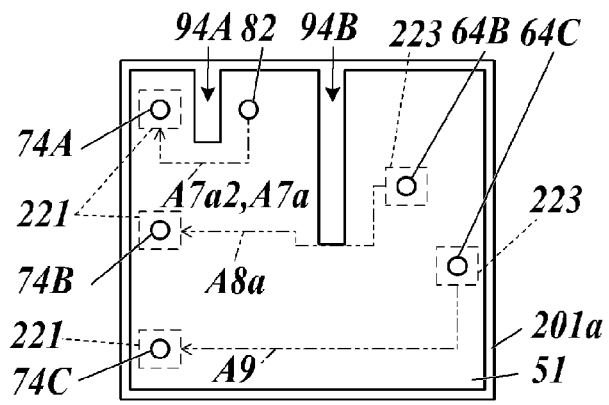
FIG. 9B is a view illustrating a first solid conductor in Arrangement example 4.
Figure 9C:
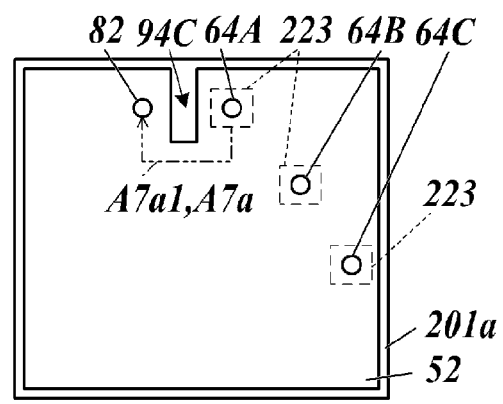
FIG. 9C is a view illustrating a second solid conductor in Arrangement example 4.
Figure 9D:
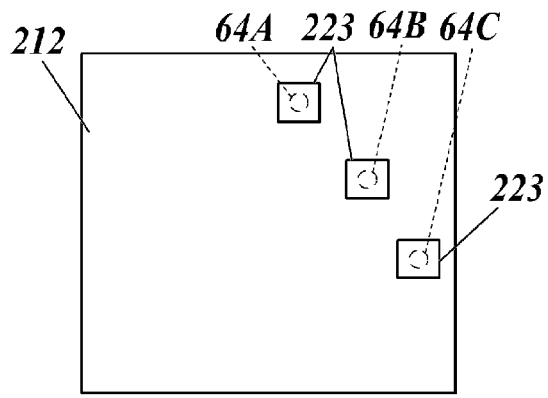
FIG. 9D is a view illustrating a second surface in Arrangement example 4.
Figure 10A:
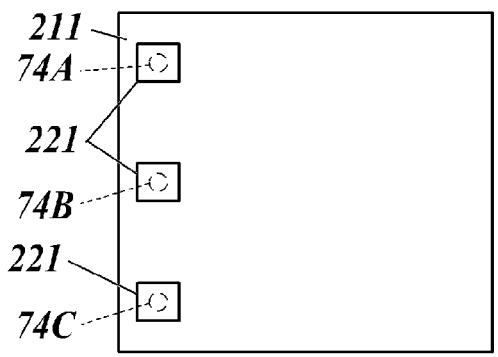
FIG. 10A is a view illustrating a first surface in Comparative example 4 that does not include a cutout.
Figure 10B:
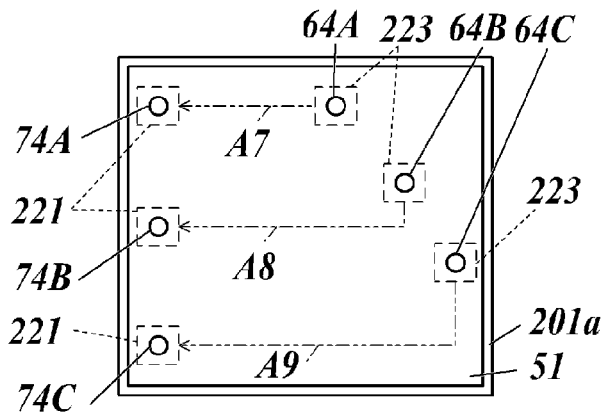
FIG. 10B is a view illustrating a first solid conductor in Comparative example 4.
Figure 10C:
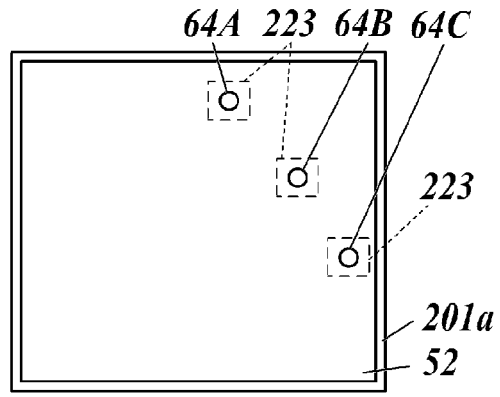
FIG. 10C is a view illustrating a second solid conductor in Comparative example 4.
Figure 10D:
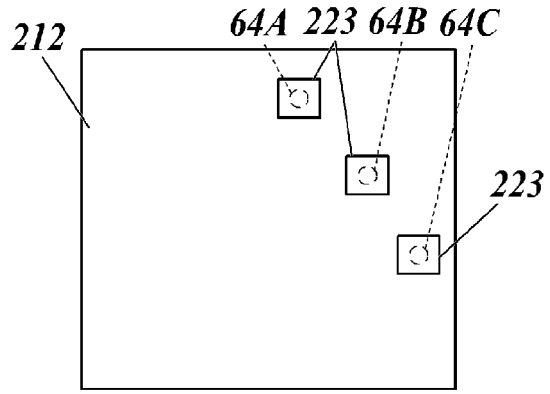
FIG. 10D is a view illustrating a second surface in Comparative example 4.
Figure 11A:
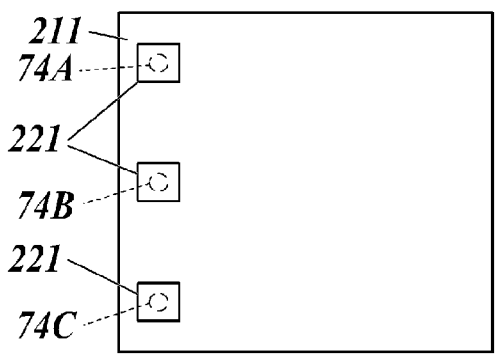
FIG. 11A is a view illustrating a first surface in Arrangement example 5.
Figure 11B:
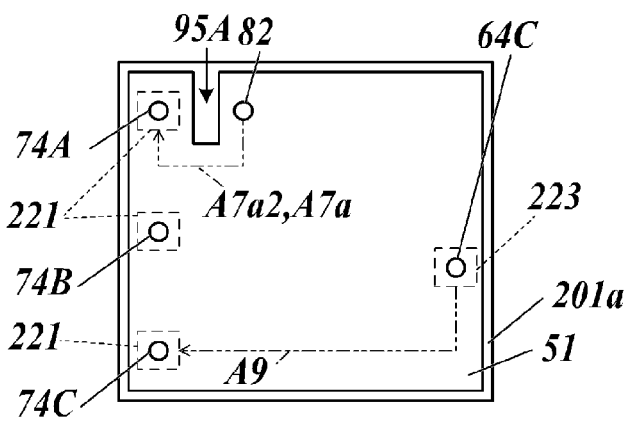
FIG. 11B is a view illustrating a first solid conductor in Arrangement example 5.
Figure 11C:
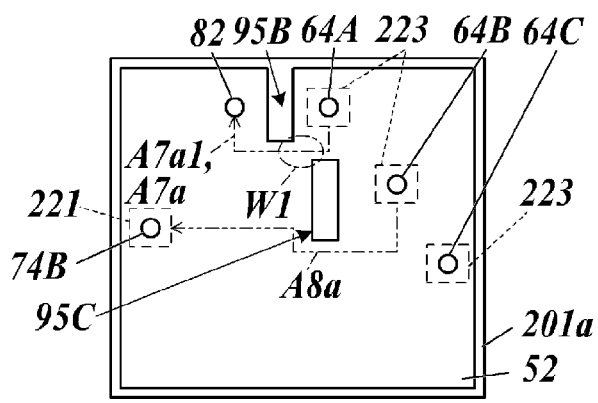
FIG. 11C is a view illustrating a second solid conductor in Arrangement example 5.
Figure 11D:
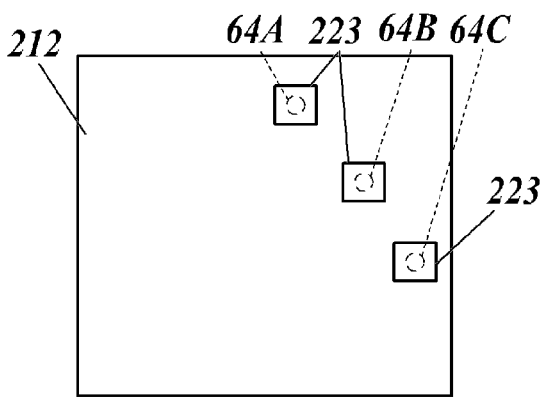
FIG. 11D is a view illustrating a second surface in Arrangement example 5.
Figure 12A:
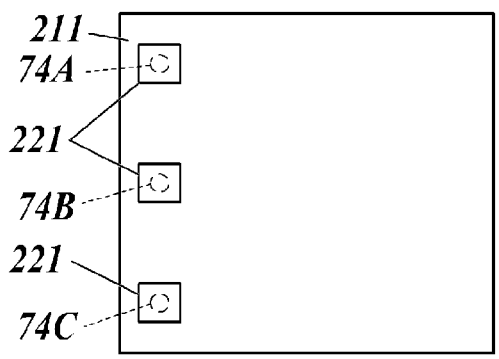
FIG. 12A is a view illustrating a first surface in Arrangement example 6.
Figure 12B:
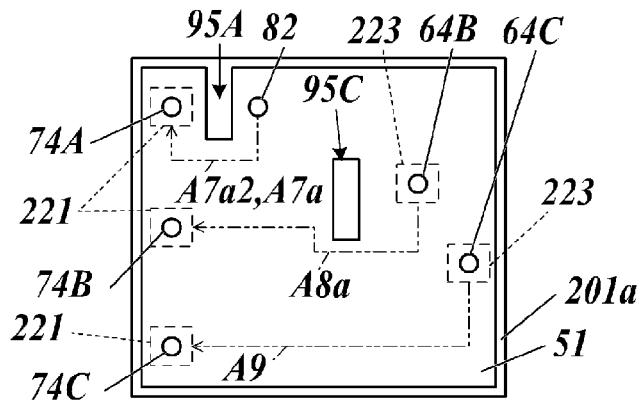
FIG. 12B is a view illustrating a first solid conductor in Arrangement example 6.
Figure 12C:
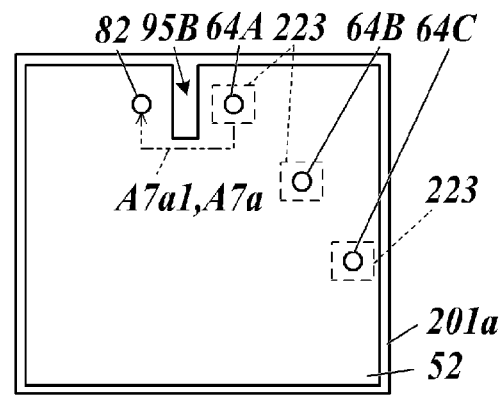
FIG. 12C is a view illustrating a second solid conductor in Arrangement example 6.
Figure 12D:
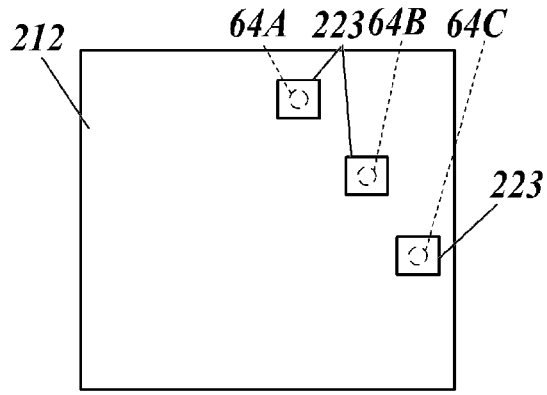
FIG. 12D is a view illustrating a second surface in Arrangement example 6.

When the cutouts are designed, the cutout 94B that acts on the current path A8a to the output via 74B is located between the other output via 74A and the input via 64A, and, in some cases, also affects the current path between these. In such a case, as illustrated in FIGS. 9B and 9C, the current path A7a1 as a part to the output via 74A is disposed in a different layer of the second solid conductor 52, such that it is possible to avoid the cutout 94B from largely affecting the current path of the output via 74A.

Arrangement Example 5

In Arrangement example 5 (FIGS. 11A to 11D) of the present embodiment, the first solid conductor 51 and the second solid conductor 52 have cutouts 95A to 95C. The cutouts 95A and 95B lengthen the shortest conduction path from the input via 64A to an intermediate via 82 and the shortest conduction path from the intermediate via 82 to the output via 74A. The cutout 95C lengthens the shortest conduction path from the input via 64B to the output via 74B. The cutout 95C does not extend to a peripheral edge of the second solid conductor 52 and is located so that the entire periphery thereof is surrounded by the second solid conductor 52.

In Arrangement example 5, the cutout 95B that acts mainly on the current path of the output via 74A and the cutout 95C that acts mainly on the current path of the other output via 74B are arranged close to each other, and a small narrow portion W1 occurs between the cutouts 95B and 95C. The small narrow portion W1 has an increased resistance, and, accordingly, can be appropriately used when it is desired to increase a voltage drop of the output via 74A at which the current path is located.

Arrangement Example 6

Arrangement example 6 (FIGS. 12A to 12D) of the present embodiment is an example in which the layer provided with the cutout 95C and the layer having the output via 74B connected thereto are changed from those in the configuration of Arrangement example 5. When it is desired to eliminate the small narrow portion W1 of the first solid conductor 51, which occurs in Arrangement example 5, the cutout 95C as one of the cutouts 95B and 95C which constitute the small narrow portion W1 is disposed in another layer like the first solid conductor 51 of Arrangement example 6, such that the small narrow portion W1 can be eliminated. When the cutout 95C is disposed in another layer, such a connection layer of the output via 74B on which the cutout 95C acts is also changed to the other layer (the first solid conductor 51), such that the shortest conduction path length of the output via 74B can be lengthened by the cutout 95C.

As described above, the plurality of solid conductors are present in the different insulating layers, the options for the arrangement of the cutouts increase in terms of adjusting the shortest conduction path lengths between the plurality of output vias and the plurality of input vias, and the difficulty of adjustment to achieve the uniformization of the power supply voltages output to the plurality of output vias is decreased.

As described above, in accordance with the circuit board 300 of the present embodiment, the uniformization of the power supply voltages output from the different positions of the solid conductor 50, the first solid conductor 51, and the second solid conductor 52 can be achieved. Moreover, in accordance with the probe card 700 of the present embodiment, which includes the circuit board 300, the uniform power supply voltages can be supplied to the plurality of power supply terminals of the semiconductor elements on a wafer SW, and a highly reliable test of the semiconductor elements can be performed.

The respective embodiments of the present disclosure have been described above. However, the circuit board and probe card of the present disclosure are not limited to those of the above-described embodiments. For example, in the above-described embodiments, the example in which the one solid conductor 50 is disposed as a solid conductor between a pair of the insulating layers (the resin insulating layers 201a or the ceramic insulating layers 1a) of the circuit board is illustrated; however, a plurality of solid conductors which are not conductive with one another may be arranged between the pair of insulating layers. For example, when the probe card 700 is connected simultaneously to a plurality of semiconductor integrated circuits on the wafer SW, one solid conductor may be arranged for each region connected to the respective semiconductor integrated circuits. Moreover, in the above-described embodiments, some specific examples of the input vias and the output vias, which are connected to the solid conductor, are schematically illustrated; however, the present disclosure is not limited to these specific examples. For example, a ratio of the number of electrodes (the external terminals 23 or the bonding conductors 223) which supply the power supply voltages to the solid conductor through the input vias to the number of electrodes (the bonding conductors 21 or the bonding conductors 221) to which the power supply voltages are output from the solid conductor through the output vias may be 1:1. Moreover, the above-described ratio may be changed so that the number of electrodes on the output side is larger, or, on the contrary, so that the number of electrodes on the input side is larger. Further, in the above-described embodiments, the example in which the circuit board of the present disclosure is applied to the probe card is illustrated; however, the circuit board of the present disclosure is applicable to a variety of circuit boards, each of which has the solid conductor. Besides, details illustrated in the embodiments are appropriately changeable within the scope without departing from the spirit of the invention.

INDUSTRIAL APPLICABILITY

The present disclosure can be used for a circuit board and a probe card.

REFERENCE SIGNS LIST 1, 201 INSULATING SUBSTRATE
1a CERAMIC INSULATING LAYER
2, 220 CIRCUIT CONDUCTOR
11, 211 FIRST SURFACE
12, 212 SECOND SURFACE
23 EXTERNAL TERMINAL
21 BONDING CONDUCTOR
221 BONDING CONDUCTOR (FIRST ELECTRODE, THIRD ELECTRODE)
223 BONDING CONDUCTOR (SECOND ELECTRODE)
22, 222 INTERNAL CONDUCTOR
50 SOLID CONDUCTOR
51 FIRST SOLID CONDUCTOR
52 SECOND SOLID CONDUCTOR
61 INPUT VIA (SECOND VIA CONDUCTOR)
61, 62A, 62B, 63A, 63B, 64A, 64B, 64C INPUT VIA
71A OUTPUT VIA (FIRST VIA CONDUCTOR)
71B OUTPUT VIA (THIRD VIA CONDUCTOR)
72A, 72B, 73A, 73B, 74A, 74B, 74C OUTPUT VIA
91, 92, 93A, 93B, 94A, 94B, 94C, 95A, 95B, 95C CUTOUT
M1, M2, M3, M4 INTER-NODE LINE SEGMENT
L1a, L2, L3a, L4a SHORTEST CONDUCTION PATH
A1 to A9, A1a, A3a, A5a, A5al, A5a2, Ala, A7al, A7a2, A8a CURRENT PATH
100 FIRST CIRCUIT BOARD
201a RESIN INSULATING LAYER
200 SECOND CIRCUIT BOARD
300 CIRCUIT BOARD
400 PROBE PIN
700 PROBE CARD

The invention claimed is:
1. A circuit board comprising:
an insulating substrate having a first surface and a second surface opposite to the first surface;
a solid conductor located inside the insulating substrate;
a first via conductor connected to the solid conductor from a side of the first surface; and
a second via conductor connected to the solid conductor from a side of the second surface, wherein
the solid conductor has a cutout that intersects a line segment that connects a node of the first via conductor and a node of the second via conductor to each other, wherein
the solid conductor includes first and second solid conductors located in different layers of the insulating substrate and made conductive with each other, and
each of the first and second solid conductors has the cutout, and
wherein
the cutout of the solid conductor on a voltage-supplied side is larger than the cutout of the solid conductor on a voltage-output side between the first solid conductor and the second solid conductor.
2. The circuit board according to claim 1, further comprising a third via conductor connected to the solid conductor from the side of the first surface, wherein
a difference in the solid conductor between a shortest conduction path length from the node of the first via conductor to the node of the second via conductor and a shortest conduction path length from the node of the first via conductor to a node of the third via conductor is smaller than a difference between a length of a line segment that connects the node of the first via conductor and the node of the second via conductor and a length of a line segment that connects the node of the first via conductor and the node of the third via conductor to each other.
3. The circuit board according to claim 2, further comprising a third electrode located on the first surface and electrically connected to the solid conductor through the third via conductor.
4. A probe card comprising:
the circuit board according to claim 1; and
a probe pin electrically connected to the solid conductor through the first via conductor.
5. The circuit board according to claim 1, wherein
a position of the cutout of the first solid conductor and a position of the cutout of the second solid conductor differ from each other when transparently viewed from a direction perpendicular to the first surface.
6. A circuit board comprising:
an insulating substrate having a first surface and a second surface opposite to the first surface;
a solid conductor located inside the insulating substrate;
a first via conductor connected to the solid conductor from a side of the first surface; and
a second via conductor connected to the solid conductor from a side of the second surface, a first electrode located on the first surface and electrically connected to the solid conductor through the first via conductor; and a second electrode located on the second surface and electrically connected to the solid conductor through the second via conductor, wherein the solid conductor has a cutout that intersects a line segment that connects a node of the first via conductor and a node of the second via conductor to each other, wherein the solid conductor includes first and second solid conductors located in different layers of the insulating substrate and made conductive with each other, and each of the first and second solid conductors has the cutout, and wherein the cutout of the solid conductor on a voltage-supplied side is larger than the cutout of the solid conductor on a voltage-output side between the first solid conductor and the second solid conductor.

7. The circuit board according to claim 6, wherein the cutout has a slit shape.

8. A probe card comprising:
the circuit board according to claim 7; and
a probe pin electrically connected to the solid conductor through the first via conductor.

9. The circuit board according to claim 7, wherein
a position of the cutout of the first solid conductor and a position of the cutout of the second solid conductor differ from each other when transparently viewed from a direction perpendicular to the first surface.

10. A probe card comprising:
the circuit board according to claim 6; and
a probe pin electrically connected to the solid conductor through the first via conductor.

11. The circuit board according to claim 6, wherein
a position of the cutout of the first solid conductor and a position of the cutout of the second solid conductor differ from each other when transparently viewed from a direction perpendicular to the first surface.

12. A circuit board comprising:
an insulating substrate having a first surface and a second surface opposite to the first surface;
a solid conductor located inside the insulating substrate;
a first via conductor connected to the solid conductor from a side of the first surface; and
a second via conductor connected to the solid conductor from a side of the second surface, wherein
the solid conductor has a cutout that intersects a line segment that connects a node of the first via conductor and a node of the second via conductor to each other,
wherein the cutout has a slit shape,
wherein
the solid conductor includes first and second solid conductors located in different layers of the insulating substrate and made conductive with each other, and
each of the first and second solid conductors has the cutout, and
wherein
the cutout of the solid conductor on a voltage-supplied side is larger than the cutout of the solid conductor on a voltage-output side between the first solid conductor and the second solid conductor.

13. A probe card comprising:
the circuit board according to claim 12; and
a probe pin electrically connected to the solid conductor through the first via conductor.

14. The circuit board according to claim 12, wherein
a position of the cutout of the first solid conductor and a position of the cutout of the second solid conductor differ from each other when transparently viewed from a direction perpendicular to the first surface.

* * * * *